(12) United States Patent
Kniess et al.

(10) Patent No.: US 9,982,113 B2
(45) Date of Patent: May 29, 2018

(54) ADDITIVE FOR LDS PLASTICS

(71) Applicant: Merck Patent GmbH, Darmstadt (DE)

(72) Inventors: Helge Bettina Kniess, Rossdorf (DE);
Ulrich Quittmann, Floersheim (DE);
Silvia Rosenberger, Bodenheim (DE)

(73) Assignee: Merck Patent GmbH, Darmstadt (DE)

( * ) Notice: Subject to any disclaimer, the term of this patent is extended or adjusted under 35 U.S.C. 154(b) by 0 days. days.

(21) Appl. No.: 15/321,907

(22) PCT Filed: Jun. 1, 2015

(86) PCT No.: PCT/EP2015/001105
§ 371 (c)(1),
(2) Date: Dec. 23, 2016

(87) PCT Pub. No.: WO2015/197157
PCT Pub. Date: Dec. 30, 2015

(65) Prior Publication Data
US 2017/0137611 A1 May 18, 2017

(30) Foreign Application Priority Data
Jun. 23, 2014 (DE) .................. 10 2014 008 963

(51) Int. Cl.
| | |
|---|---|
| B32B 3/00 | (2006.01) |
| C08K 9/02 | (2006.01) |
| H05K 1/03 | (2006.01) |
| C08K 3/22 | (2006.01) |
| C08K 9/12 | (2006.01) |
| C09C 1/36 | (2006.01) |

(52) U.S. Cl.
CPC .............. C08K 9/02 (2013.01); C08K 3/22 (2013.01); C08K 9/12 (2013.01); C09C 1/3661 (2013.01); H05K 1/0353 (2013.01); *C01P 2004/84* (2013.01); *C08K 2003/2231* (2013.01); *C08K 2201/002* (2013.01)

(58) Field of Classification Search
CPC ... C08K 3/22; C08K 9/12; C08K 9/22; C08K 2003/2231
See application file for complete search history.

(56) References Cited

U.S. PATENT DOCUMENTS

| | | | |
|---|---|---|---|
| 5,202,211 | A | 4/1993 | Vercoulen et al. |
| 5,350,448 | A | 9/1994 | Dietz et al. |
| 6,319,564 | B1 | 11/2001 | Naundorf et al. |
| 2002/0053661 | A1 | 5/2002 | Glausch |
| 2004/0241422 | A1 | 12/2004 | Naundorf et al. |
| 2008/0087888 | A1* | 4/2008 | Morisue ............ H01L 51/0012 257/40 |
| 2012/0276390 | A1* | 11/2012 | Ji ........................ H05K 3/185 428/412 |
| 2013/0168133 | A1* | 7/2013 | Schrauwen ........ H05K 1/0373 174/250 |
| 2016/0295705 | A1* | 10/2016 | Stoeppelmann ......... C08K 3/22 |

FOREIGN PATENT DOCUMENTS

| | | |
|---|---|---|
| DE | 4006044 A1 | 8/1991 |
| DE | 4237355 A1 | 5/1994 |
| DE | 10051872 C2 | 11/2002 |
| DE | 102004045305 A1 | 3/2006 |
| EP | 0441427 A1 | 8/1991 |
| EP | 0567868 A1 | 11/1993 |
| EP | 0627385 A1 | 12/1994 |
| EP | 0917597 B1 | 1/2003 |
| EP | 1274288 B1 | 3/2005 |
| EP | 1647997 A1 | 4/2006 |
| JP | 5071621 B2 | 11/2012 |
| JP | 5181322 B2 | 4/2013 |
| WO | 2012/056416 A1 | 5/2012 |
| WO | 2012/126831 A1 | 9/2012 |

OTHER PUBLICATIONS

International Search Report dated Aug. 6, 2015 issued in corresponding PCT/EP2015/001105, 2 pages.
English translation Abstract of EP0917597B1 published Jan. 15, 2003 (2 pages).
English translation Abstract of EP1274288B1 published Mar. 9, 2005 (1 page).
English translation Abstract of EP0627385A1 published Dec. 7, 1994 (2 pages).
English translation Abstract of DE4006044A1 published Aug. 29, 1991 (1 page).
English translation Abstract of JP5181322B2 published Apr. 10, 2013 (1 page).
English translation Abstract of DE4237355A1 published May 11, 1994 (2 pages).
English translation Abstract of DE10051872C2 published Nov. 21, 2002 (1 page).
English translation Abstract of EP067868A1 published Nov. 3, 1993 (1 page).
English translation Abstract of JP5071621B2 published Nov. 14, 2012 (1 page).

* cited by examiner

*Primary Examiner* — Elizabeth E Mulvaney
(74) *Attorney, Agent, or Firm* — Millen White Zelano & Branigan, PC

(57) ABSTRACT

The present invention relates to an LDS-active additive for LDS plastics, to a polymer composition comprising an additive of this type, and to an article having metallized conductor tracks in which a polymeric basic body of the article or a polymeric coating on a basic body comprises an LDS additive of the said type.

20 Claims, 1 Drawing Sheet

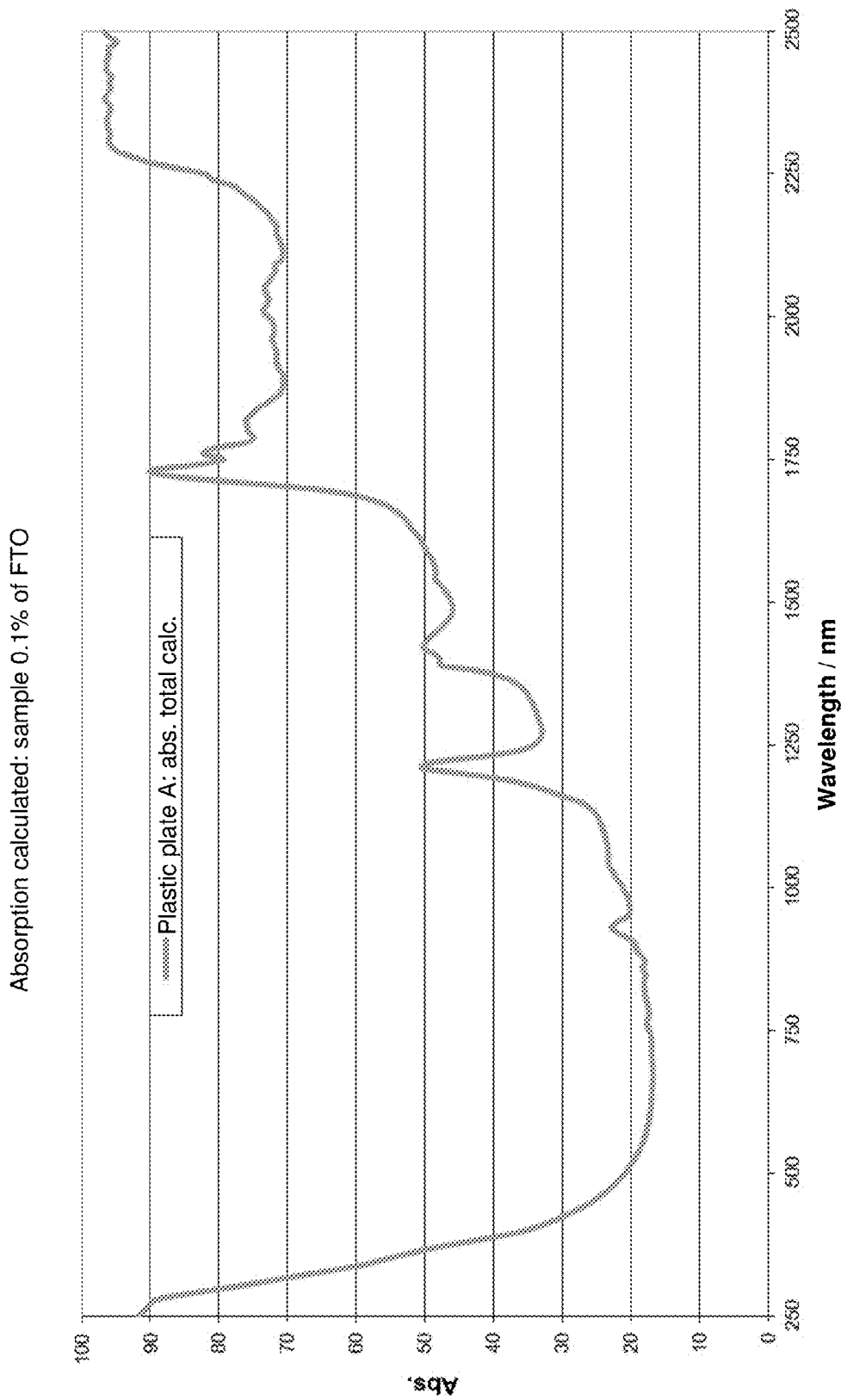

ADDITIVE FOR LDS PLASTICS

The present invention relates to an LDS-active additive for LDS plastics, and in particular to the use of pigments which comprise doped tin dioxide which is doped with non-metallic elements as LDS additive in polymer compositions which are used for an LDS process, to a polymer composition comprising an additive of this type, and to an article having metallised conductor tracks in which a polymeric basic body of the article or a polymeric coating on a basic body comprises an LDS additive of the said type.

Three-dimensional plastic components which carry circuits, so-called MIDs (moulded interconnect devices), have established themselves on the market for years and have made a crucial contribution to facilitating state-of-the-art technologies in relation to many applications, for example in telecommunications, in automobile construction or medical technology. Equally, they make a significant contribution to miniaturisation and complexity of the individual electronic components in such applications.

There are various methods for the production of three-dimensional MIDs by means of which the basic components comprising plastic or having a plastic-containing coating which are obtained, for example, by means of 2-component injection moulding or hot embossing are provided with the requisite circuit structures. In general, this requires special product-specific moulds, which are expensive to purchase and inflexible in use.

By contrast, the LDS process (laser direct structuring process) developed by the LPKF company offers the crucial advantage that the circuit structures can be cut directly and in an individually adapted manner into the plastic base part or the plastic-containing coating on the base part by a laser beam and can subsequently be metallised.

Simpler processes, such as, for example, the 1-component injection-moulding process, are suitable for the production of the plastic base parts, and the cutting-in of the circuit structures can likewise be controlled three-dimensionally.

In order to be able to obtain circuit structures which can be metallised by laser beam, a so-called LDS additive must be added to the plastic base part or the plastic-containing coating. This additive must react to laser radiation and at the same time prepare for the later metallisation. The LDS additive generally comprises metal compounds which are activated during treatment with the laser beam in the laser-treated areas in such a way that metal nuclei are liberated which favour the later deposition of electrically conductive metals for the formation of electrical circuits at the activated points in the plastic. At the same time, these metal compounds react laser-actively (in general laser-absorbently) and ensure that the plastic is ablated and carbonised in the laser-treated areas, so that a circuit structure is engraved into the plastic base part. The metal compounds remain unchanged at the points in the plastic which have not been activated by the laser. The LDS additives can either be added to the plastic material as a whole before the shaping to give the plastic base part or alternatively may only be present on the surface into which the circuit structure is to be cut by laser beam as a constituent in a separate plastic-containing layer, a coating, a paint layer or the like.

On treatment with the laser beam, besides the future circuit structure containing metal nuclei, a microrough surface also arises within the circuit structure, which provides the prerequisite for the conductive metal, generally copper, to be able to anchor itself to the plastic with strong adhesion during the subsequent metallisation.

The metallisation is generally subsequently carried out in currentless copper baths, which may be followed by a further application of nickel and gold layers, likewise in currentless baths. However, other metals, such as tin, silver and palladium, may also be applied, optionally in combination with, for example, gold. The plastic components pre-structured in this way are subsequently fitted with the individual electronic components.

The objective of the LDS process consists in producing three-dimensional electrically conductive circuit structures on three-dimensional plastic basic bodies or basic bodies having a plastic-containing coating. It goes without saying that, for this purpose, only the metallised circuit structures produced may have electrical conductivity, but not the plastic basic body or the coating itself. LDS additives which have therefore been proposed in the past are generally additives which do not themselves have electrical conductivity and also do not impart electrical conductivity on the base material.

Originally, non-conductive organic heavy-metal complexes, in particular containing palladium (EP 0 917 597 B1), were intended as LDS additive.

In EP 1 274 288 B1, non-conductive inorganic metal compounds which are insoluble in the application medium and are inorganic metal compounds of metals of the d and f group of the Periodic Table with non-metals are added as LDS additive to plastics. Preference is given to the use of copper compounds, in particular copper spinels.

However, organic Pd complexes or also copper spinels have the disadvantage that they have a dark inherent coloration themselves and likewise impart a dark colour on plastics comprising them. In addition, the copper compounds in particular effect partial degradation of the plastic molecules surrounding them. In particular for MIDs which are to be used in telecommunications, however, there is an increased demand for plastics which have a pale inherent coloration, so that they can be coloured with all desired coloured hues without it being necessary to add coloured pigments in such a large proportion by weight that the efficacy of the LDS additives is adversely affected or weakened. In addition, degradation of the plastic base is undesired.

In order to make plastics having a pale inherent colour accessible for the LDS process, WO 2012/126831 therefore proposed LDS-suitable plastics and a corresponding LDS process in which an LDS additive which comprises antimony-doped tin dioxide and has an L* value (luminance) of at least 45 in the CIELab colour space is added. Mica coated with antimony-doped tin dioxide is preferably employed in amounts of 2 to 25% by weight, based on the entire plastic material. Furthermore, white coloured pigments may additionally be added for even paler colouring of the plastic material.

WO 2012/056416 also discloses a composition which comprises 0.5 to 25% by weight of a metal oxide-coated filler, where the latter is preferably mica coated with antimony-doped tin dioxide. The LDS plastic material has L* values of 40 to 85. Coloured pigments may likewise also be added to the plastic material.

Although the addition of LDS additives which comprise antimony-doped tin dioxide results in pale, readily colourable plastics which can be provided directly with metallic conduction structures by the LDS process, the use of antimony as dopant is subject to administrative restrictions in some countries, since environmental damage thereby is feared, which could occur, in particular, during the preparation or recycling of the corresponding compounds or components comprising them. The same restrictions in some cases also apply country-specifically to compounds which contain other heavy metals.

There was therefore still a need for plastics which are suitable for the LDS process and have a pale inherent colour. In particular, there was a need for suitable antimony-free LDS additives for plastics which are preferably additionally also HF-suitable, where the LDS additives should preferably have the lowest possible proportion of various heavy metals. All other requirements of an LDS additive must of course also be complied with here, namely the ability to be activated by laser radiation, the liberation of metal nuclei by laser bombardment and the formation of a microrough surface by the laser beam as basis for the subsequent metallisation.

The object of the present invention consequently consists in providing an antimony-free LDS additive for LDS plastics which, through its pale inherent coloration, enables the production of pale LDS plastics which can readily be coloured using small amounts of colorant admixtures in chromatic colours, which imparts dielectric or only such slight electrically conductive properties on the plastic provided therewith that this plastic is suitable for high-frequency applications, which if possible prevents the decomposition of the surrounding plastic matrix and which in addition enables good metallisability of the circuit structures obtainable in the LDS process on use of a largest-possible bandwidth of laser parameters. In addition, the LDS additive should as far as possible contain no further heavy metal besides tin.

A further object of the present invention consists in providing a polymeric composition which is suitable for the LDS process and has the properties described above.

An additional object of the present invention consists in providing articles which have a circuit structure produced in the LDS process and have the properties mentioned above.

The object of the present invention is achieved by the use of pigments which comprise doped tin dioxide as LDS additive (laser direct structuring additive) in a polymeric composition, where the doping consists of one or more non-metallic elements.

The object of the present invention is furthermore also achieved by a polymeric composition comprising at least one organic polymeric plastic and an LDS additive, where the LDS additive comprises pigments which comprise doped tin dioxide, where the doping consists of one or more non-metallic elements.

In addition, the object of the invention is achieved by an article having a circuit structure produced in an LDS process, consisting of a plastic basic body or a basic body having a plastic-containing coating and metallic conductor tracks located on the surface of the basic body or coating, where the plastic basic body or the plastic-containing coating of the basic body comprises an LDS additive which comprises pigments which comprise doped tin dioxide, where the doping consists of one or more non-metallic elements.

Pigments which comprise or consist of tin oxide doped with non-metallic elements are known per se. They have electrical conductivity and likewise impart electrical conductivity on the coatings or plastics which comprise them in adequate concentration. They are therefore usually employed as antistatics in coatings and plastics. However, they are likewise suitable for the formation of electrically conductive layers in displays and solar cells, for example as replacement for expensive ITO (indium-doped tin oxide).

Surprisingly, however, it has now been found that pigments which comprise a tin dioxide doped with non-metallic elements are very highly suitable as LDS additive in a polymeric composition.

The present invention therefore relates to the use of the said pigments as LDS additive in polymeric compositions for use in the LDS process.

In accordance with the invention, the most suitable non-metallic elements for doping of the tin dioxide are the elements fluorine, iodine, bromine, chlorine, boron, nitrogen or phosphorus, either alone or in combination of at least two thereof. The elements are preferably employed alone or in the combinations fluorine/nitrogen or fluorine/phosphorus. Particular preference is given to doping with fluorine as the sole doping element.

The LDS additive pigments employed in accordance with the invention which comprise tin dioxide doped with non-metallic elements may have various compositions.

In a first, simplest embodiment, the LDS additive pigments employed in accordance with the invention consist of tin dioxide doped with non-metallic elements. In this embodiment, the pigments can be either in the form of monodisperse primary particles or also in the form of agglomerates. They have particle sizes in the range from 0.001 to 100 µm, preferably in the range from 0.01 to 50 µm and in particular in the range from 0.1 to 30 µm, based on primary particles. In accordance with the invention, agglomerates generally have particle sizes in the range from 1 to 100 µm, preferably from 5 to 50 µm and in particular from >5 to 30 µm.

The corresponding particle sizes are selected here depending on the principal requirements of the respective application. Thus, smaller particle sizes in the range up to 5 µm are considered in particular if highly transparent, virtually colourless particles are desired which are able to impart the desired colour neutrality on the use medium, whereas particle sizes greater than about 5 µm increasingly result in greater roughness of the laser-treated surfaces and thus in better adhesion of the electrically conductive metal layer subsequently applied (plating index), but are accompanied by a slight loss in the luminance of the plastics.

With respect to the particle shape, the pigments described above are not subject to any restrictions. They can be, for example, spherical, oval, rod-shaped, in flake form or in the form of regular or irregular polygons (granules). Preference is given to round shapes, where "spherical" and "oval" naturally do not correspond to the exact geometrical definition, but instead to the industrially achievable shape.

Pigments of the type described above are known and commercially available. They can be prepared, for example, by the processes described in DE 4006044 A1, EP 627385 A1 or JP 5181322 B.

In a second embodiment, the LDS additive pigments employed in accordance with the invention consist of a substrate and a coating located on the substrate. The coating preferably envelops the substrate completely or at least partly. In this embodiment, the tin dioxide doped with non-metallic elements is preferably located in the coating.

Suitable substrates for the last-mentioned variant of the second embodiment are both silicate materials and also, preferably, known white pigments. Suitable silicate materials are, for example, talc, kaolin, natural or synthetic mica, feldspar, wollastonite, natural or synthetic silicon dioxide or also various barytes. Of these, mica and silicon dioxide are particularly preferred. White pigments employed are, in particular, zinc sulfide and titanium dioxide, which may be both in the anatase and also, preferably, in the rutile modification, and also various potassium titanates ($K_2O \cdot 6TiO_2$, $K_2O \cdot 8TiO_2$).

For the use according to the invention as LDS additive, the above-mentioned substrates have a coating which comprises doped tin dioxide which is doped with non-metallic elements. The coating here may be formed in one or more layers. If it is formed in a number of layers, at least one of the coating layers must consist of the doped tin dioxide. In general, this coating layer will be the layer formed on the surface of the pigment, while one or more interlayers may be located between the substrate and the coating layer comprising doped tin dioxide. The coating on the substrate is preferably formed in one layer and consists of the doped tin dioxide.

The coating generally has a geometrical thickness in the range from 1 to 300 nm, in particular from 10 to 200 nm.

Pigments of this type are likewise known and commercially available. They can be prepared, for example, by the processes described in DE 4237355 A1, DE 10051872 C2, EP 1647997 A1, EP 567868 A1 and JP 5071621 B.

Due to the comparatively high percentage proportion by weight of the substrates, very pale LDS additives which result in a very pale colour in the plastics provided therewith can be obtained in this way. At the same time, the proportion of the doped tin dioxide layer, which is at least 10% by weight, preferably 20 to 70% by weight, based on the weight of the entire pigment, is sufficient to generate the requisite sensitivity for laser radiation in the plastics and to facilitate subsequent metallisation of the structures prespecified by laser.

The LDS additive pigments of the second embodiment employed in accordance with the invention have particle sizes in the range from 2 to 100 μm, in particular from >5 to 50 μm, preferably from 6 to 30 μm. The outer shape of the pigments here is determined in accordance with the shape of the substrates employed. These may have been formed isotropically (without preferential direction) or anisotropically (with preferential direction) and are generally, as already described above in the case of the support-free pigments, in the form of spheres, oval bodies, rods, flakes or granules.

All particle sizes indicated above can be determined using conventional methods for particle size determination. Particular preference is given to a method for particle size determination by the laser diffraction method, in which both the nominal particle size of the individual particles and also their percentage particle size distribution can advantageously be determined. Preference is given to the use of a Malvern 2000 instrument from Malvern Instruments Ltd., UK, under standard conditions of ISO/DIS 13320.

The tin dioxide doped with non-metallic elements is, irrespective of whether it is employed in pure form or as a coating on a substrate, a material in which the percentage molar proportion of doping elements, relative to tin, is from 1 to 20 mol-%, preferably from 1 to 15 mol-%, based on the total molar mass of doping elements and tin. In the case of doping with a plurality of the non-metallic elements mentioned, for example with fluorine in combination with nitrogen or phosphorus (F/N or F/P doping), the entire molar proportion of all doping elements is likewise in the above-mentioned range. In the case of F/N or F/P doping, the fluorine content here is in all cases significantly higher than the proportion of nitrogen or phosphorus.

The tin dioxide pigments described which are doped with non-metallic elements are present in the respective polymeric composition as LDS additive in an amount of 0.1 to 30% by weight, preferably 0.5 to 15% by weight, and in particular >1 to 10% by weight, in each case based on the total weight of the polymeric composition. They can also be employed in the LDS-capable polymeric composition in mixtures with other LDS additives known from the prior art. In the latter case, the proportion of LDS additive according to the invention is reduced by the proportion of the other LDS additive(s). In total, the proportion of LDS additives is generally not more than the 30% by weight indicated above, based on the total weight of the LDS-capable polymeric composition. The pigments comprising tin dioxide doped with non-metallic elements are preferably employed as the sole LDS additive in the LDS-suitable polymeric compositions. In particular in the case of the use of tin dioxide doped with fluorine as sole doping element, the resultant pigment has, on use as LDS additive, particularly high selective sensitivity (absorption capacity) for IR radiation, which is used by many laser devices. In the case of pigments comprising fluorine-doped tin dioxide, the concentration of these LDS additives in the polymeric composition may therefore be slightly reduced (>1 to 5% by weight), which, in the case of good plating behaviour, at the same time also results in a very pale colour of the plastic composition.

The polymeric composition can be either a thermoplastic or thermosetting polymeric composition. Depending on the desired application of the polymeric LDS-suitable materials, either the thermoplastic or the thermosetting composition may be preferred in each case.

Both of the corresponding thermoplastic and thermosetting polymeric compositions are composed to a predominant proportion (in general >50% by weight) of thermoplastics or thermosetting plastics.

Suitable thermoplastics are amorphous and semi-crystalline thermoplastics in a large choice of materials, such as a wide variety of polyamides (PA), polycarbonate (PC), polyphthalamide (PPA), polyphenylene oxide (PPO), polybutylene terephthalate (PBT), cycloolefin polymers (COP), liquid-crystal polymers (LCP) or also copolymers or blends thereof, such as, for example, acrylonitrile-butadiene-styrene/polycarbonate blend (PC/ABS) or PBT/PET. They are available in qualities suitable for LDS from all well-known polymer manufacturers.

Suitable thermosetting plastics are, in particular, various polyurethanes, melamine resins, phenolic resins, polyesters and epoxy resins.

The LDS additives described in accordance with the invention can be incorporated into the polymeric composition by, for example, compounding, via masterbatches, via pastes or by direct addition in the shaping processing step.

In addition, the polymeric compositions which comprise the doped pigments used in accordance with the invention as LDS additive may optionally additionally also comprise fillers and/or colorants as well as stabilisers, assistants and/or flameproofing agents.

Suitable fillers are, for example, various silicates, $SiO_2$, talc, kaolin, mica, wollastonite, glass fibres, glass beads, carbon fibres or the like.

Suitable colorants are both organic dyes and also inorganic or organic coloured pigments. Since the LDS plastic compositions provided with the LDS additives employed in accordance with the invention are very pale and can thus readily be coloured, virtually all soluble dyes or insoluble coloured pigments which are suitable for plastics can be used. Examples which may be mentioned here are merely the particularly frequently used white pigments $TiO_2$, ZnO, $BaSO_4$ and $CaCO_3$. The amount and type of the fillers and/or colorants added are limited here merely by the respective specific material nature of the individual LDS-suitable compositions, in particular the plastics used.

Surprisingly, it has been found that the doped pigments employed in accordance with the invention, which consist of at least 10% by weight, based on the total weight of the pigments, of tin dioxide doped with non-metallic elements, in particular tin dioxide doped with F, I, Br, Cl, B, N and/or P, are very highly suitable as LDS additives and, even in the polymeric compositions for the LDS process to which they have been added in a conventional use concentration of 0.1 to 30% by weight, do not result in the formation of electrical conduction paths in the polymeric basic body or the polymer-containing coating on the basic body of the articles to be produced, although the pigments as such have inherent electrical conductivity. The polymeric compositions provided with the LDS additive employed in accordance with the invention are therefore also suitable for applications in the high-frequency area. Since the LDS additives according to the invention react selectively very sensitively (absorb) to laser beams in the IR region (infrared wavelength region of light having wavelengths greater than 780 nm), their proportion by weight in the polymeric composition may be settled in the lower region of the proportions indicated or on the other hand the laser energy to be used can be reduced. Furthermore, they have a pale, white-grey to pale-grey inherent coloration which does not impart an interfering dark inherent colour on the plastics to which they have been added. The LDS-suitable plastics which comprise the LDS additive according to the invention can thus be coloured if necessary using all chromatic colorants without a large amount of colorants reducing or negating the efficacy of the LDS additive. At the same time, however, the LDS additives employed in accordance with the invention have high laser activity and, when subjected to a laser in the LDS process, result in the desired microrough surfaces within the conduction structures ablated and carbonised by the laser beam, enabling subsequent metallisation in good quality. Under best conditions, excellent metallisation is just as possible as, particularly surprisingly, very good metallisability with a large bandwidth of various laser settings. The conditions for the laser action which are most suitable for the circumstances actually present can thus be selected in each case for the LDS process, without reductions in quality being expected in the case of the subsequent metallisation. In addition, their use as LDS additive in plastic-containing polymeric compositions also does not result in degradation of the organic polymer molecules surrounding the composite pigments. In addition, they are free from antimony and, apart from tin, other heavy metals (with the prerequisite that all metals whose density is >5 g/cm$^3$ are regarded as heavy metals).

The present invention also relates to a polymeric composition which comprises at least one organic polymeric plastic and an LDS additive, where the LDS additive comprises pigments which comprise doped tin dioxide, and where the doping consists of one or more non-metallic elements. The non-metallic elements here are preferably selected from fluorine, iodine, bromine, chlorine, boron, nitrogen and phosphorus, either individually or in a mixture of at least two thereof. A tin dioxide merely doped with fluorine (FTO) is particularly preferably employed. The tin dioxide doped with non-metallic elements can be employed here in particulate form directly as pigment or alternatively can also be in the form of a constituent of a pigment which is composed of a substrate and a coating. The doped tin dioxide here is generally located in the coating on the substrate; the coating is preferably composed entirely or partly of the doped tin dioxide. The polymeric composition according to the invention comprises the LDS additive in a proportion of 0.1 to 30% by weight, preferably 0.5 to 15% by weight, and in particular >1 to 10% by weight, based on the total weight of the polymeric composition.

Details in respect of the material composition of the LDS additive, the polymer materials employed and any assistants and additives present, such as fillers, colorants and the like, have already been described above. Reference thereto is made here.

The polymeric composition according to the invention is intended for use in an LDS process (laser direct structuring process) for the production of metallised circuit structures on three-dimensional plastic basic bodies or three-dimensional basic bodies carrying plastic-containing coatings. It has, without the use of colorants, such a pale inherent colour that it can if necessary be coloured using conventional dyes and/or coloured pigments, is highly suitable for use in high-frequency applications and, through the addition of the LDS additive according to the invention, effects good metallisability of the conduction structures produced by laser beam, where the laser parameters can be selected in a broad spectrum. The LDS additive added is free from antimony and, apart from tin, comprises no further metallic constituents.

The present invention also relates to an article having a circuit structure produced in an LDS process, where the article consists of a polymeric basic body or a basic body of the article having a polymer-containing coating and of metallic conductor tracks which are located on the surface of the basic body or on the surface of the polymer-containing coating of the basic body, where the polymeric basic body or the polymer-containing coating of the basic body comprises an LDS additive which comprises pigments which comprise tin dioxide doped with non-metallic elements. The non-metallic elements employed are preferably fluorine, iodine, bromine, chlorine, boron, nitrogen and/or phosphorus. Such articles, in particular articles comprising organic thermoplastics or thermosetting plastics, are used, for example, in telecommunications, medical technology or in automobile construction, where they are used, for example, as electronic components of mobile telephones, hearing aids, dental instruments, auto electronics and the like.

BRIEF DESCRIPTION OF DRAWINGS

FIG. 1: shows the absorption curve of a plastic plate having a content of 0.1% by weight of FTO The present invention will be explained below with reference to examples, but will not be restricted thereto.

EXAMPLE 1

A) Preparation of a Pigment Having an FTO (F,SnO$_2$) Layer on a TiO$_2$ Support Material:
The pigment is prepared in accordance with Example 1 of DE 4237355 A1:
156.7 g of tin(II) fluoride are dissolved in 3 l of water. 80 g of titanium dioxide particles (particle size 100-300 nm) are added to this solution with vigorous stirring. The dispersion is heated to 85 to 90° C. A solution of 260.5 g of tin tetrachloride in 943 ml of ethanol is added dropwise at a pH of 3.5 to 4.5. During the addition, the pH is kept constant by simultaneous addition of 5% ammonia solution. When the SnCl$_4$ addition is complete, the temperature is kept constant for a further hour, and the mixture is subsequently filtered. The filter cake is washed a number of times with water. The product is dried and calcined at 500° C. The calcination duration is 10 minutes.

B) Preparation of a Pigment Comprising FTO

The pigment is prepared in accordance with Example 2 of DE 4006044 A1:

250 g of tin(II) oxide, 14.75 g of tin(II) chloride and 14.75 g of tin(II) fluoride are mixed intimately with one another by grinding for 10 minutes in a mortar mill. The substance mixture obtained in this way is calcined at 300° C. in a corundum dish for 1 hour. After cooling, the pale-grey, electrically conductive, doped tin oxide obtained in this way is ground for a further 10 minutes in a mortar mill.

Use as LDS Additive:

5% by weight of the LDS additive prepared in accordance with procedure B) are incorporated into PC/ABS (Xantar C CM 406, Mitsubishi Engineering Plastics) by means of a co-rotating twin-screw extruder. The extrudate is strand pelletised and subsequently dried at 100° C. for 4 hours. Test plates having the dimensions 60×90×1.5 mm are then injection-moulded in an injection-moulding machine.

The test plates are treated by means of a 1064 nm fibre laser with different laser powers and frequencies in the range from 3-16 W and 60-100 kHz in test fields in a grid in such a way that slight material ablation takes place with simultaneous carbonisation of the treated area. Metallisation with copper is subsequently carried out in a commercially available reductive copper bath (MID Copper 100 B1, MacDermid). The metallisation properties are assessed with reference to the structure of the copper layer on the substrate. The plating index (according to MacDermid) is indicated, which is obtained from the quotient of the built-up copper layer of the test material and the built-up copper layer of the reference material. The reference material used is PBT test plates having a proportion of 5% by weight of copper spinel (reference).

COMPARATIVE EXAMPLE 1

Analogously to Example 1, 5% by weight of a pigment are incorporated as LDS additive into the PC/ABS test plates, where the pigment has an antimony-doped tin dioxide layer on a mica substrate. The pigment is a product from Merck KGaA which is commercially available under the name Iriotec® 8825.

| Laser setting | Plating index Cu spinel (reference) | Comp. Ex. 1 | Ex. 1 |
| --- | --- | --- | --- |
| 3 W/60 kHz | 0.41 | 0.00 | 0.00 |
| 4 W/60 kHz | 0.56 | 0.00 | 0.00 |
| 5 W/60 kHz | 0.65 | 0.00 | 0.00 |
| 6 W/60 kHz | 0.71 | 0.00 | 0.15 |
| 8 W/60 kHz | 0.69 | 0.15 | 0.65 |
| 4 W/80 kHz | 0.65 | 0.00 | 0.00 |
| 6 W/80 kHz | 0.83 | 0.00 | 0.00 |
| 8 W/80 kHz | 0.76 | 0.00 | 0.36 |
| 10 W/80 kHz | 0.73 | 0.00 | 1.02 |
| 12 W/80 kHz | 0.70 | 0.16 | 0.93 |
| 14 W/80 kHz | 0.63 | 0.54 | 0.81 |
| 6 W/100 kHz | 0.88 | 0.00 | 0.01 |
| 8 W/100 kHz | 0.79 | 0.00 | 0.18 |
| 10 W/100 kHz | 0.70 | 0.00 | 0.86 |
| 12 W/100 kHz | 0.68 | 0.00 | 0.93 |
| 14 W/100 kHz | 0.72 | 0.34 | 0.85 |
| 16 W/100 kHz | 0.67 | 0.75 | 0.83 |

The experiments show that the fluorine-doped tin dioxide employed in accordance with the invention as LDS additive exhibits significantly better values with respect to the metallisability both in the range of the laser parameters and also with respect to the nominal values of the plating index than the mica flakes in accordance with Comparative Example 1 which are coated with antimony-doped tin dioxide, is comparable with Cu spinel (reference) in the peak values and exhibits very good metallisation values, in particular at relatively high laser power.

The invention claimed is:

1. A method of preparing a polymeric composition for use in laser direct structuring, said method comprising adding to the polymeric composition a pigment which comprises doped tin dioxide as a laser direct structuring additive, wherein the doping consists of one or more non-metallic elements.

2. The method according to claim 1, wherein the doping is selected from one or more of the elements fluorine, iodine, bromine, chlorine, boron, phosphorus and nitrogen.

3. The method according to claim 1, wherein the tin dioxide is doped with fluorine.

4. The method according to claim 1, wherein the pigments consist of the doped tin dioxide.

5. The method according to claim 1, wherein the pigments each consist of a substrate and a coating located thereon, and the doped tin dioxide is present in the coating.

6. The method according to claim 5, wherein the substrate has an isotropic or anisotropic form.

7. The method according to claim 5, wherein the substrate consists of a silicate material, zinc sulfide, titanium dioxide or potassium titanate and has a coating which comprises said doped tin dioxide.

8. The method according to claim 1, wherein the doped tin dioxide has a percentage molar proportion of doping elements of 1 to 20 mol-%, based on the total molar mass of tin and doping element(s).

9. The method according to claim 1, wherein the pigments have a particle size in the range from in each case 0.001 to 100 μm.

10. The method according to claim 1, wherein the pigments are present in the polymeric composition in a proportion in the range from 0.1 to 30% by weight, based on the total weight of the polymeric composition.

11. The method according to claim 1, wherein the polymeric composition comprises at least one organic polymeric plastic and optionally fillers and/or colorants besides the laser direct structuring additive.

12. The method according to claim 1, wherein the doped tin dioxide is present in the polymeric composition in a mixture with further conventional laser direct structuring additives.

13. A polymeric composition comprising at least one organic polymeric plastic and a laser direct structuring additive, where the laser direct structuring additive comprises pigments which comprise doped tin dioxide, where the doping consists of one or more non-metallic elements.

14. A polymeric composition according to claim 13, wherein the laser direct structuring additive is present in the polymeric composition in a proportion of 0.1 to 30% by weight, based on the total weight of the polymeric composition.

15. A polymeric composition according to claim 13, wherein the polymeric composition is a thermoplastic or thermosetting material.

16. An article having a circuit structure produced in a laser direct structuring process, consisting of a plastic basic body or a basic body having a plastic-containing coating and metallic conductor tracks located on the surface of the basic body or coating, where the plastic basic body or the plastic-containing coating of the basic body comprises a laser direct structuring additive which comprises pigments which comprise doped tin dioxide, where the doping consists of one or more non-metallic elements.

17. The method according to claim 1, wherein the doping is a combination of fluorine and nitrogen or a combination of fluorine and phosphorus.

18. The method according to claim 5, wherein the pigments comprise the doped tin dioxide in an amount of at least 10% by weight, based on the weight of the entire pigment.

19. The method according to claim 5, wherein the coating has a geometrical thickness in the range from 1 to 300 nm.

20. The method according to claim 1, wherein the pigments are present in the polymeric composition in a proportion in the range from 0.5 to 15% by weight, based on the total weight of the polymeric composition.

* * * * *